United States Patent
Bennett et al.

(10) Patent No.: US 6,701,133 B1
(45) Date of Patent: Mar. 2, 2004

(54) APPARATUS FOR AND METHOD OF SYNCHRONISING OSCILLATORS WITHIN A DATA COMMUNICATION SYSTEM

(75) Inventors: Richard Michael Bennett, Salisbury (GB); Andrew Bateman, Bath (GB)

(73) Assignee: Fairfield Industries, Inc., Sugar Land, TX (US)

( * ) Notice: Subject to any disclaimer, the term of this patent is extended or adjusted under 35 U.S.C. 154(b) by 0 days.

(21) Appl. No.: 09/530,625

(22) PCT Filed: Nov. 3, 1998

(86) PCT No.: PCT/GB98/03292

§ 371 (c)(1), (2), (4) Date: Oct. 6, 2000

(87) PCT Pub. No.: WO99/23759

PCT Pub. Date: May 14, 1999

(30) Foreign Application Priority Data

Nov. 3, 1997 (GB) .............................................. 9723189

(51) Int. Cl.[7] .............................. H04B 1/00; H04B 7/00
(52) U.S. Cl. .......................... 455/71; 455/47; 455/502; 370/503; 370/526; 375/362
(58) Field of Search ........................... 455/70, 255, 71, 455/265, 47, 267, 48, 142, 104, 203, 500, 208, 502, 260, 507, 517, 522, 702, 703; 375/260, 279, 284, 356, 362, 365, 366–368; 370/319, 324, 344, 350, 441, 480, 491, 500, 503, 518, 526

(56) References Cited

U.S. PATENT DOCUMENTS

| | | | | |
|---|---|---|---|---|
| 4,172,995 A | * | 10/1979 | Yoshisato | 455/87 |
| 4,479,256 A | * | 10/1984 | Sewerinson | 455/265 |
| 4,618,996 A | * | 10/1986 | Rafal et al. | 455/46 |
| 5,943,375 A | * | 8/1999 | Veintimilla | 375/355 |
| 5,949,796 A | * | 9/1999 | Kumar | 370/529 |

* cited by examiner

*Primary Examiner*—Edward F. Urban
*Assistant Examiner*—Simon Nguyen
(74) *Attorney, Agent, or Firm*—Jackson Walker L.L.P.; Mark A. Tidwell, Esq.

(57) ABSTRACT

A method and apparatus is provided for locking a local oscillator to a reference oscillator. The reference oscillator is arranged to transmit a signal containing two reference pilot tones in a signal sideband. The apparatus samples the received signal and makes a frequency shifted copy where the shift is equal to the expected separation between the reference tones. The non-shifted and shifted signals are then combined in the frequency domain to constructively reinforce one of the reference pilot tones which is then searched for. Once the tone has been identified, a correction to the local oscillator frequency is calculated. The apparatus may be of particular use in a radio telemetry system in which it is important that the frequency of the local oscillators in the transmitters and receivers are very accurately matched to each other and where, in order to reduce interference, all the clocks used in the system are locked to a master clock.

20 Claims, 4 Drawing Sheets

RESULT OF CORRELATION
OF DOPPLER COMPONENTS

APPARATUS FOR AND METHOD OF SYNCHRONISING OSCILLATORS WITHIN A DATA COMMUNICATION SYSTEM

The present invention relates to an apparatus for and a method of synchronising oscillators within a communication system. An example of such a system is a radio telemetry system where incoming data at a baseband frequency is frequency converted for transmission at radio frequencies.

In a radio based communication system, input data, for example speech or signals from a sensor generally occupy a relatively low frequency range, referred to in the art as the baseband. The baseband signals are frequency up converted for transmission over the radio link. Frequency up conversion can be performed by mixing (ie multiplying) the baseband signals with a frequency derived from a local oscillator.

Assuming, for the purposes of simplicity, that the baseband signal comprises a continuous tone having a frequency $\omega_B$, and that the local oscillator has a frequency $\omega_L$, then it is well known in the art that the result of the mixing will produce signals at frequencies $\omega_L - \omega_B$ and $\omega_L + \omega_B$ this mixing process gives rise to the two side bands which are centred on the local oscillator frequency $\omega_L$. One or both of these signals may then be transmitted in accordance with known transmission schemes. Assuming for simplicity that only the upper side band is transmitted, then the receiver is arranged to recover the baseband by mixing the incoming signal $(\omega_L + \omega_B)$ with a signal $\omega_L'$ derived from a local oscillator.

This will produce signals at the sum and difference frequencies $\omega_L' + \omega_L + \omega_B$ and $\omega_L - \omega_L' + \omega_B$. If $\omega_L$ and $\omega_L'$ are identical then the recovered signal would be at the frequency $\omega_B$ (the term $\omega_L' + \omega_L + \omega_B$ being ignored as it occurs outside a system passband). However if the local oscillators are not accurately matched then the term $\omega_L - \omega_L'$) will be non zero and a frequency error would be introduced into the recovered signal. The above discussion has ignored the contribution of the phase shift, but this is also significant and in order to accurately recover the baseband signal the outputs $\omega_L$ and $\omega_L'$ from each of the oscillators must be accurately matched both in frequency and phase.

A seismic data transmission system must recover amplitude, frequency and phase information from each of the geophones (or hydrophones) if the subsequent data processing for normal move out correction, dip move out correction and the like is to be accurately performed. It is important that the frequency of the local oscillators in the transmitters and receivers in such a radio telemetry system are very accurately matched. One approach to achieve this is to use a highly stable and accurate frequency reference in each receiver and transmitter unit. However, if frequency errors of approximately one part per million or less are required over a wide temperature range, then high accuracy temperature controlled references are required, these tend to be expensive, bulky and power hungry and are therefore not suitable for use in portable battery powered radio units.

U.S. Pat. No. 4,188,579 describes a system wherein a local oscillator in a receiver is tuned to a transmitter oscillator by referring to two pilot signals in the received signals.

According to one aspect, the invention provides data communication system comprising a master unit containing a master clock and at least one remote unit, the or each remote unit having a local oscillator, in which the master unit transmits a signal containing at least first and second pilot signals at predetermined frequencies, and in which the or each remote unit is arranged to receive the pilot signals, to compare the frequencies of the received pilot signals with a local record of their frequencies, and to adjust the frequency of the local oscillator to reduce the difference between the received and expected pilot signal frequencies to below a threshold, wherein the received pilot signals comprise a pilot tone recovered from both the upper and lower sidebands of a carrier signal comprising the received signals.

According to another aspect, the invention provides data communication system comprising a master unit containing a master clock and at least one remote unit, the or each remote unit having a local oscillator, in which the master unit transmits a signal containing at least first and second pilot signals at predetermined frequencies, and in which the or each remote unit is arranged to receive the pilot signals, to compare the frequencies of the received pilot signals with a local record of their frequencies, and to adjust the frequency of the local oscillator to reduce the difference between the received and expected pilot signal frequencies to below a threshold, wherein the pilot signals comprise two pilot tones and the pilot signal comparison comprises locating the received pilot signals by looking for two tones in the received signals which are separated by the frequency difference between the pilot tones.

According to another aspect, the invention provides a data communication system comprising a master unit containing a master clock and at least one remote unit, the or each remote unit having a local oscillator, in which the master unit transmits a signal containing at least first and second pilot signals at predetermined frequencies, and in which the or each remote unit is arranged to receive the pilot signals, to compare the frequencies of the received pilot signals with a local record of their frequencies, and to adjust the frequency of the local oscillator to reduce the difference between the received and expected pilot signal frequencies to below a threshold, wherein the pilot signal comparison comprises using a frequency shifted copy of the received signals to locate the received pilot signals in the received signals.

The invention also relates to corresponding methods of synchronising oscillators.

It is thus possible to provide a communication system in which the remote units can be provided with relatively inexpensive local oscillators which are controlled so as to lock on to a master oscillator.

Preferably the pilot signals have a narrow frequency spread and may be regarded as pilot tones.

Preferably the pilot tones are inserted into a baseband signal which is modulated by the transmitter. The pilot tones may both occur in the or each sideband of the transmitted signal. They may be modulated to include information for identification purposes or information transfer purposes.

Advantageously the power of the received pilot tones may be used to estimate the transmission loss occurring between the base station and a remote unit. This estimate may then be used to control the transmit power of the remote unit, in order to ensure that it's signal is received with sufficient, but not excessive, power at the base station.

Preferably the or each remote unit is arranged at least intermittently, to monitor the signal from the master unit and to demodulate the signal therefrom to recover the baseband signals and hence the pilot tones. The or each remote unit down converts the incoming radio frequency signal by mixing it with a local oscillator. The or each remote unit includes a quadrature detector within its radio receiver such that both the in-phase and quadrature components of the baseband signal are output from the detector.

A signal processor is arranged to locate the pilots tones within the demodulated baseband signal and to use these to adjust the frequency of the local oscillator. Such signal processing may be performed in the analogue or digital domain and in hardware or software. Digital signal processors are now available at reasonable costs and are especially suited to this processing task. Preferably the signal processor is arranged to identify the pilot tones by looking for the known frequency difference between the pilot tones.

The use of two pilot tones for frequency locking of the local oscillator significantly enhances the reliability of the system. Each local unit is likely to be employed in a potentially noisy environment (in terms of electrical and radio frequency interference), and consequently a phase locked loop seeking to lock to a single pilot tone would run a significant risk of locking to a spurious or noise signal. By seeking to lock to two tones separated by a known frequency, this risk is significantly reduced. For example, in a transmission scheme transmitting both upper and lower side bands, the pilot tones may be equally spaced about the carrier frequency. Thus the pilot tones may be correlated with respect to one another. Whilst the concept underlying the invention can be more easily envisaged when the pilot tones have discrete positive frequencies in the baseband such that both tones occur in a, or each, sideband, it will be appreciated that frequency down conversion gives rise to the possibility of one or both of the pilot tones having a negative frequency. From consideration of a geometrical representation of cyclical motion, where an oscillating variable is represented as a line of fixed length undergoing circular motion and the in-phase and quadrature components are represented by the projections onto the orthogonal X and Y axes of the representation, then it will be observed that a positive frequency has the following components:

$$\text{In-phase} = \cos wt$$
$$\text{quadrature} = \sin wt$$

and a negative (ie counter rotating) frequency has the following components:

$$\text{In-phase} = \cos wt$$
$$\text{quadrature} = -\sin wt$$

Thus, in a system where phase information exists, negative frequencies can occur and be properly handled in subsequent processing operations, such as frequency shifting.

Advantageously, the signal processor is arranged to make a copy of the input signal and to frequency shift the copy by a frequency nominally equal to the separation between the first and second pilot tones.

Advantageously the pilot tones are identified by performing a frequency domain analysis of the sampled input signal. Various frequency domain analysis techniques may be used, but for speed and simplicity a fast Fourier transform may be performed. Advantageously the fast Fourier transform is restricted or windowed in order to compensate for the fact that it is operating on a data signal of limited temporal length. The fast Fourier transform is a complex fast Fourier transform in order to maintain both the magnitude and phase of each signal. The fast Fourier transform outputs the magnitude and phase of the input signal in a series of frequency bins (ie frequency slots). Advantageously, some of these bins may be blanked out in order to remove spurious components. The frequency domain results for the shifted and non shifted samples are then combined, taking account of their phase such that vectors due to the pilot signals have the same phase and tend to combine in magnitude. The signal processing is performed on signal buffers of fixed lengths. In order to improve the signal to noise ratio, the processed results of several buffers are averaged. Advantageously the spread of frequencies is correlated in order to combine energy in Doppler shifted versions of the pilot signals. Doppler shifting may occur because one of the radio units is moving with respect to the other, for example a base station may be mobile whereas the local transmitters connected to geophones are stationary, or because one or both the base station and remote units are moving with respect to the transmission media, as happens in marine seismic surveying whereby the hydrophones may be towed by a survey vessel.

The signal processor searches through the processed spectrum of the received signal to find the largest peak. Assuming that the input data was copied and the copy (or original) was up shifted in frequency, then the largest peak should correspond to the frequency of the upper pilot tone. Advantageously the signal processor is then arranged to estimate a measure of confidence in the fact that it has correctly identified the correct pilot tone. In order to do this, it may apply a two part test. As the first part of the test, the peak may be required to exceed a predetermined threshold either in absolute terms, or in respect to the amount by which it exceeds the remaining signals. Secondly, the magnitude of the largest peak may be compared to the magnitude of the second largest peak. This ratio may also be used to indicate the degree of confidence that a satisfactory lock has been achieved. If the difference between the magnitudes is small, then there is little confidence that the peak found is genuine. Thus the search process may be re-initiated.

Once the signal processor has found the pilot tones with sufficient confidence, a new control voltage for the oscillator is calculated and generated based upon the error between the expected pilot tone frequencies and the received pilot tone frequencies. If the frequency error is within predetermined limits, then the local oscillator is deemed to be locked, otherwise the local oscillator control voltage is updated in an attempt to establish an acceptable lock.

According to another aspect of the present invention, there is provided an apparatus arranged to frequency lock to a carrier signal comprising a pilot tone occurring in upper and lower sidebands of the carrier signal, characterised in that the apparatus is arranged to demodulate the received signal to recover a first pilot tone from the upper side band and a second pilot tone from the lower side band, and to locate the pilot tones by searching for signals separated by a frequency corresponding to an expected frequency separation between the first and second pilot tones, and generating a measure indicative of an error between the expected frequencies of the demodulated pilot tones and the actual frequencies of the demodulated pilot tones.

According to a further aspect of the present invention there is provided a method for reducing interference in a telemetry unit of a telemetry system, the method comprising generating all the clocks used in the telemetry units by locking them to a local master clock, such that any harmonic interference due to mixing of clock frequencies is predictable.

According to a further aspect of the present invention, there is provided a method of controlling clocks within a plurality of remote units in a distributed data collection system, comprising transmitting at least one reference signal from a master unit, and adjusting the clocks within the remote units to lock onto the reference signal.

Thus, once the local oscillator in each remote unit has been correctly locked by reducing the frequency error of the pilot tones to within an acceptable margin, it follows that the local oscillators of each remote unit are operating at substantially the same frequency.

The present invention will further be described, by way of example, with reference to the accompanying drawings, in which.

Figure 1:
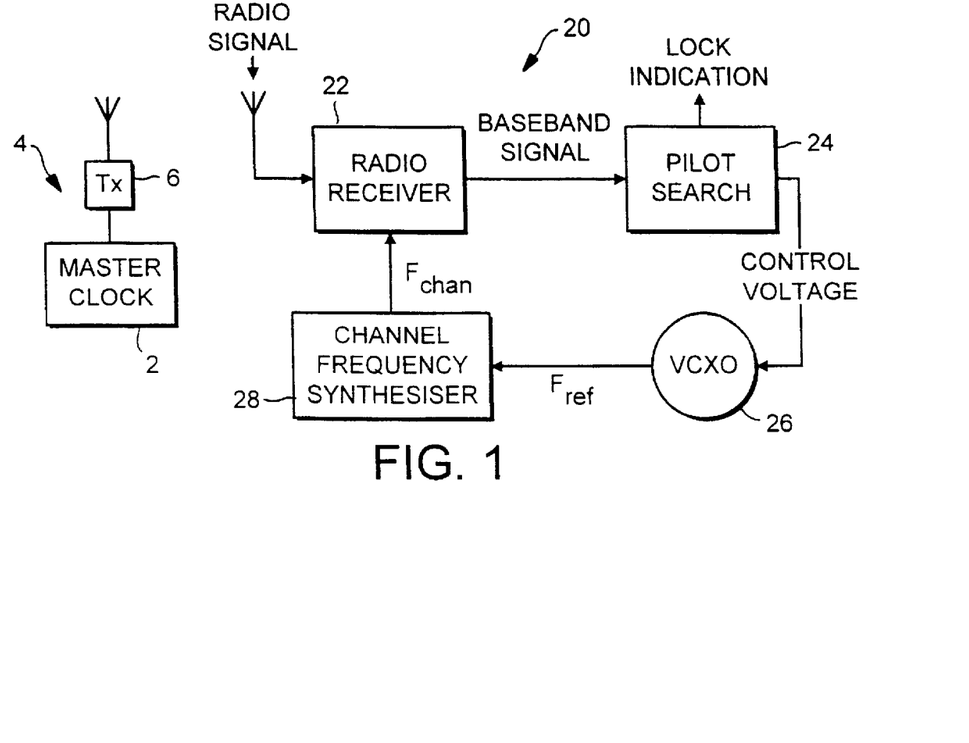
FIG. 1 schematically illustrates a radio communication system constituting an embodiment of the present invention.
Figure 2:
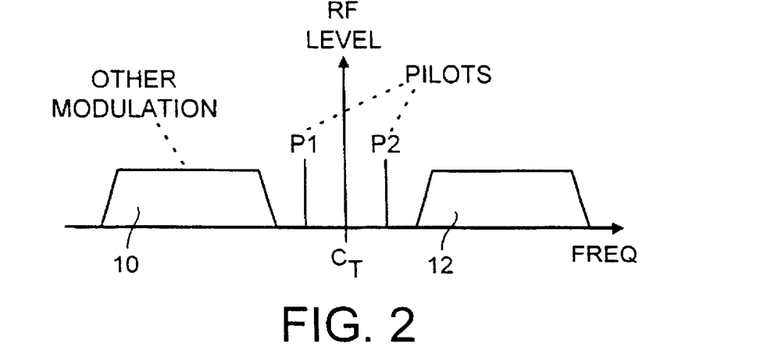
FIG. 2 schematically illustrates the transmit frequency spectrum of the transmitter.

As shown in FIG. 1, a master clock 2 at a base station 4 is used to generate the timing signals for a radio telemetry system. The master clock is also used to generate the local oscillator frequency for the transmitter 6 of the base station 4 (for example by frequency multiplication) and may also be divided down to generate the pilot signals. The pilot signals are baseband signals and, for convenience, may be of a relatively low frequency, for example in the frequency range of a few hundred Hz. The baseband signals are then modulated and transmitted. FIG. 2 schematically illustrates the radio frequency transmission spectrum of the base station 4, the spectrum comprises a nominal carrier frequency $C_T$. In the exemplary embodiment shown in FIG. 2, the pilot signals P1 and P2 are equally spaced either side of the carrier frequency $C_T$ in the transmission spectrum. Additional signal data falls within modulation envelopes 10 and 12 in the upper and lower side bands respectively. When the signal is returned to baseband by demodulation, this will result in the pilot signal P2 having a frequency +F and the pilot signal P1 having a frequency −F, the negative frequency −F manifests itself in the real world as a further signal having frequency +F with an associated phase shift of π radians in its quadrature (out of phase) signal portion. It has however been demonstrated both by mathematical computation and by physical experimentation that it is irrelevant whether the pilot signals P1 and P2 each have positive frequencies, negative frequencies or a mixture of positive or negative as this does not effect the subsequent processing steps or the identification of the pilot tones.

Returning to FIG. 1, the remote unit 20 comprises a heterodyne radio receiver 22, a signal processor 24 for searching for the pilot tones, and a voltage controlled oscillator 26 which, in conjunction with a channel frequency synthesiser 28 generates the local oscillator frequency.

Figure 3:
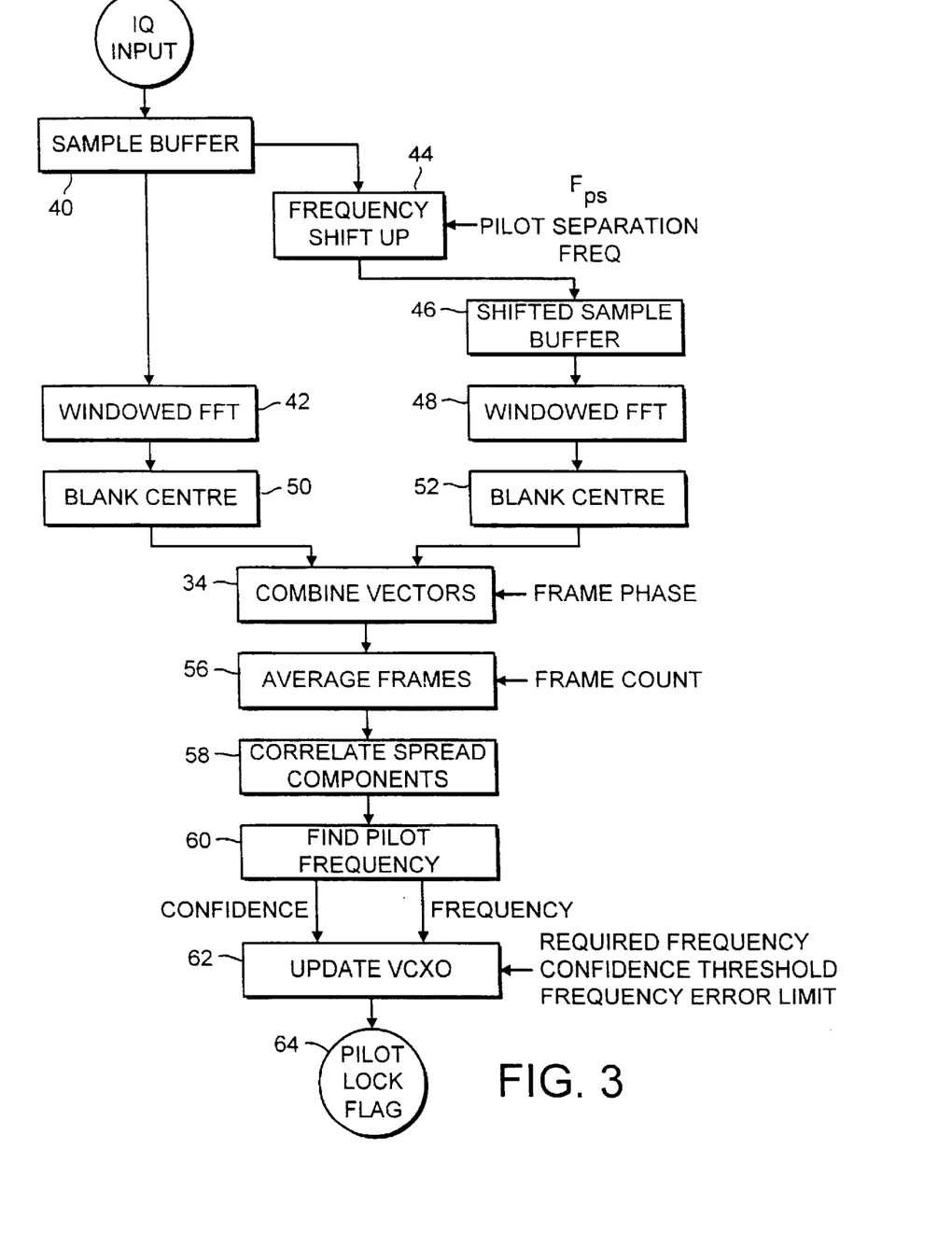
FIG. 3 is a block diagram illustrating the signalling processing steps used to recover the pilot frequencies.
Figure 5A:
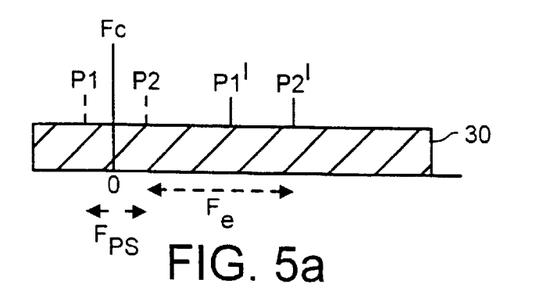
FIGS. 5a to 5e schematically illustrate signal spectrum at various stages of the signal processing.
Figure 5B:
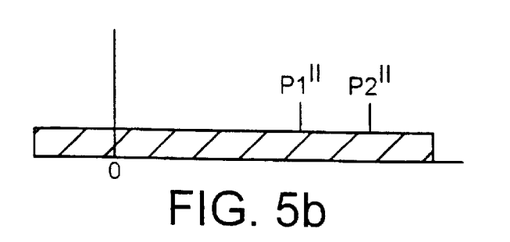

FIG. 5a schematically illustrates the frequency spectrum of a signal appearing at an output of the radio receiver 22. The signal comprises an in channel noise component 30. The signal also includes received pilot signals P1' and P2' which have become frequency shifted by a frequency error $F_E$. This error may arise due to motion of the transmitter, the receiver or both or because of a frequency error in the local oscillator of the radio receiver. The output of the radio receiver 22 is supplied to the signal processor 24 in order to search for the pilot signals. The signal processor 24 receives in phase and quadrature inputs from the receiver 22, digitises these and stores them in a sample buffer 40, as shown in FIG. 3. A first output of the sample buffer supplies a copy of the input signal to a fast Fourier transform circuit or algorithm 42 (since the data processing can be performed in hardware or software). A second output of the sample buffer supplies a copy of the input signal to a frequency converter 44 which frequency up shifts the sampled signals by a frequency $F_{PS}$ corresponding to the frequency separating the first and second pilot signals P1 and P2. The up shifted frequency is temporarily stored in a buffer 46 before being Fourier transformed by a Fourier transform circuit or algorithm 48. FIG. 5b schematically represents the baseband signal of the frequency up shifted input sample at the output of the frequency shifter 44. This creates two new copies of the pilot signals P1" and P2". It will be observed that the frequency P2' should coincide with the frequency P1". The output of the fast Fourier transform element 42 is processed by a circuit or algorithm 50 to block out those frequency components occurring at or adjacent zero Hz. A similar algorithm or circuit 52 blanks out the frequencies of the shifted Fourier transform occurring at or adjacent the frequency $F_{PS}$. It has been found, in practice, that the respective Fourier transformed version of the sample buffer and shifted sample buffer contain components at zero Hz and $F_{PS}$ which may be due to switch on transient in the receiver hardware. The spurious components could upset the further processing of the signals and consequently are removed at the elements 50 and 52.

The Fourier transform signals are then combined at step 54. A phase correction is applied based on start time of frames (ie the discrete data runs collected in the sample buffer 40) so that vectors due to pilot signals have the same phase in each frame and hence tend to add in magnitude.

An algorithm combines the results of the fast Fourier Transform (FFT) sample buffers, and produces:

Magnitude of result $|C_n|=|A_n|*|B_n|$

Phase of result/_$C_n$=_$A_n$_$B_n$+$P_c$ where:

$A_n$ is the nth element of the FFT of the unshifted buffer, $B_n$ is the nth element of the FFT of the shifted buffer, $C_n$ is the nth element of the result, and $P_n$ is a phase correction angle.

The purpose of this calculation is to produce a single vector for each frequency bin which only has a large magnitude if there is significant energy in the equivalent bin in both buffers, ie there is energy both at a particular frequency and a frequency lower by the pilot separation frequency.

The phase of the result is important as further processing (described later) operates on the array of vectors, so that vectors with the same angle will add, and others will tend to cancel.

The phase correction angle Pc is introduced for an implementation reason. An oscillator is used to shift the input samples by the pilot separation frequency to produce the shifted sample buffer. If this oscillator were run continuously at exactly the pilot separation frequency, the term Pc would not be required. The vector due to combining the pilot tones would have the same angle for every frame of samples. In practice, samples are collected for the frame, with a gap between frames while pilot search processing is performed. The shift oscillator is stopped to reduce the processor load and simplify the software structure. The shift oscillator is started at every frame with an identical phase. Pc corrects the phase so that the oscillator would have had if it had been run continuously. It is given by:

$$Pc=2*Pi*Fps*(tn-tl)$$

where Fps is shift oscillator frequency (=pilot separation frequency), tn is the time that the first sample of the current frame was sampled, and tl is the time that the first sample of the first frame was sampled.

Figure 4:
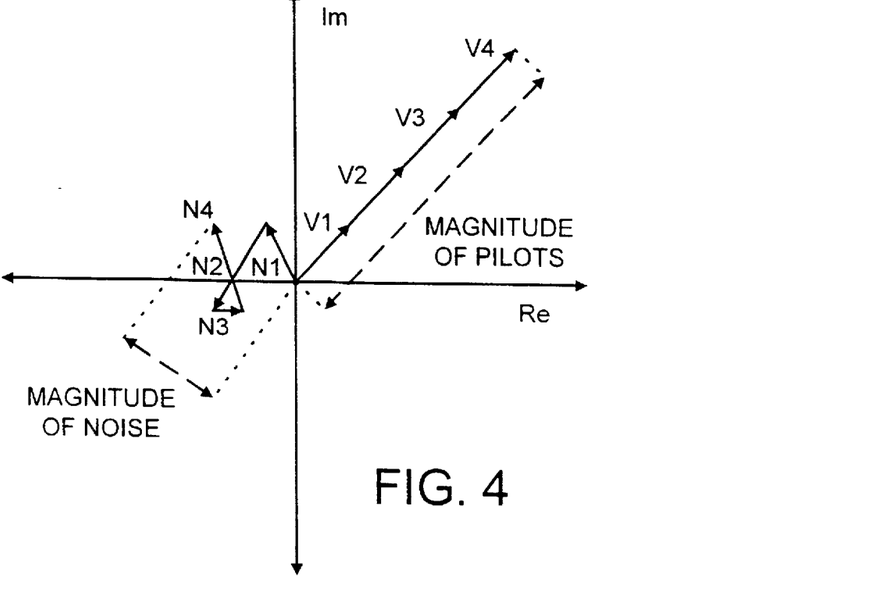
FIG. 4 schematically illustrates the averaging of pilot vectors in order to improve the signal to noise ratio.
Figure 5C:
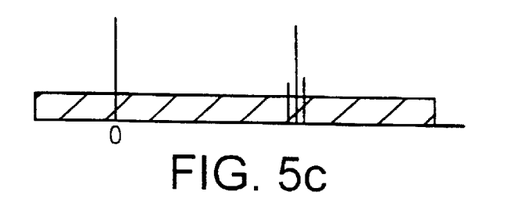
Figure 5D:
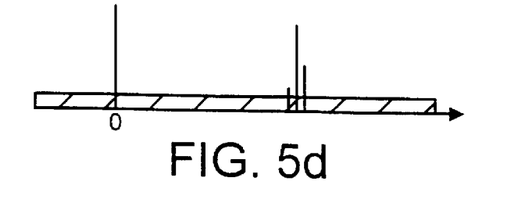
Figure 5E:
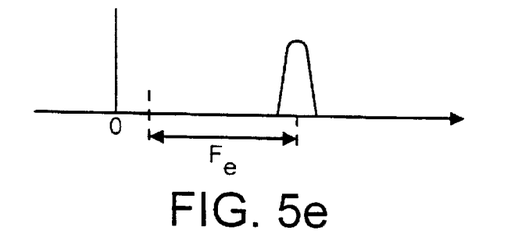

In order to further enhance the signal to noise ratio and to reject energy which has almost, but not quite, the pilot separation frequency, the output of block 54 is averaged for a plurality of frames by an averaging element 56. The vectors due to pilots, which have the same phase from frame to frame, will continue to add, while other vectors, due to noise and other frequency components, which tend to be random in their phase will not be enhanced. This is schematically illustrated in FIG. 4, which shows vectors V1 to V4 from successive outputs of the combine vector element 54 reinforce each other to increase their magnitude, whereas noise vectors N1 to N4, corresponding to uncorrelated signals have random phases so that their resultant magnitude remains small. FIG. 5c schematically represents the frequency spectrum at the output of element 54, whereas FIG. 5d schematically illustrates the improvement in the signal noise ratio following averaging. It should be noted that FIGS. 5c, 5d and 5e are drawn on a different frequency scale to FIGS. 5a and 5b.

The averaged vectors are passed to a frequency correlater 58 which takes each frequency bin from the averaged Fourier transform and correlates it with a range of frequencies either side corresponding to a maximum expected frequency spread. Vectors due to frequency components of the pilots add, whereas other vectors will not. This ensures that frequency shifted components (for example due to Doppler shifting) of the pilot still contribute to the detection process. The result of the correlation leads to a spectrum schematically illustrated in FIG. 5e. The correlation further improves the signal to noise ratio.

In particular the result from combining multiple frames is further processed as follows:

$$En = \text{sum } Dn+k \text{ for } k=0 \text{ to } C$$

Where:

En is the nth element of the result,

Dn is the nth element of the result of the average stage, and

C is 2* max expected Doppler shift in Hz/width of each FFT bin in Hz.

Figure 6:
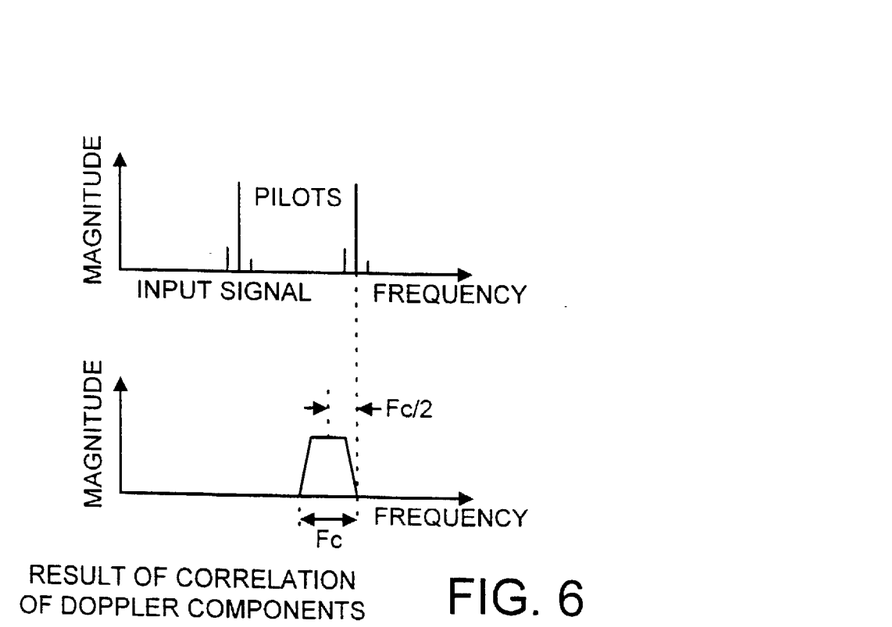
FIG. 6 schematically illustrates the result of correlation of Doppler components.

Pilot signals with Dopplar shift will produce a spectrum like that shown in FIG. 6.

The frequency of the centre of the correlation peak is lower than the frequency of the upper pilot by Fc/2, where Fc is the frequency range in Hz over which the correlation is performed (=2*max expected Doppler frequency).

A technique is used to find the centre of the correlation peak which with few multi-path components is approximately trapezoidal. The method used is to find the peak value element of the result (which may not be the centre of the peak due to the relative flatness of the peak). The centre of the correlation peak is estimated by performing the calculation:

$$B_{pk} = \text{Sum}(C_{m+k}*(m+k))/\text{Sum}(m=k)$$

where the m is the bin number of peak value, k is from −C to +C, and C is the correlation range in bins.

Further improvements can be made by excluding bins in the sum where the value of the bin is less than a certain fraction of the peak value. These are assumed to be noise values outside the main peak.

The result is the bin number of the centre of the correlation peak. This result can be accurate to a fraction of a bin so allowing an estimate of the pilot frequency to a resolution better than the original FFT resolution.

Finally the result is generated for the estimate for the frequency of the upper pilot:

$$F_{up} = (B_{pk}*Fs/N) - Fc/2$$

Where:

Fc is the correlation frequency range in Hz,

Fs is the FFT sampling frequency in Hz,

N is the FFT order,

Bpk is the bin number of the correlation result, and

Fup is the estimate of the frequency of the upper pilot.

The signals are now passed to block 60 which searches the spectrum to locate the largest peak, which occurs at the frequency P2−Fc/2. Once the largest peak has been found, its frequency is output to block 62 for calculating the correction to the control voltage for the local oscillator. Block 60 also calculates a parameter representing the confidence or expectation value that the pilot frequency has been correctly identified. In order to do this two tests are applied to the peak. Initially it is thresholded against a predetermined value. If this test is passed, then the ratio between the highest peak and the next highest peak is calculated. This ratio can be taken to be a measure of confidence that the correct peak has been identified. There should be other peaks corresponding to unshifted P1 and shifted P2.

However spurious peaks may occur due to the presence of strongly interfering tones, saturation occurring within the receiver at high noise levels. If the main peak is not significantly greater than the others then there is little confidence that the pilot tones have been correctly identified and so the algorithm starts again.

Assuming that the estimate of confidence exceeds the required confidence threshold, a correction to the local frequency oscillator is instigated. The whole correction process is then repeated. Once the error has been reduced to within an acceptable threshold, a flag 64 is inserted to show that the system is locked.

It may be possible that no pilots are found. This might occur because the pilot signals are not present, or that the received pilot signals P1' and P2' fall close to zero Hz and $F_{PS}$ respectively and hence are blanked out by signal processing at elements 50 and 52. In this latter case, the frequency of the voltage controlled oscillator can be dithered between successive searches, successively frequency shifting the signal up and down thereby causing the hidden pilot signal at 0 Hz to become visible.

Once a lock has been achieved, the output from the controlled oscillator can be used to synthesize the radio channel frequency. It can also be used to provide timing signals for the sampling clocks used in analogue to digital and digital to analogue converters, and also to provide the sampling clocks used within the digital signal processing hardware or software, data rate clock generation, seismic data sampling clocks, processor and control clocks, and may also be used to control a switch mode power supply unit's switching frequency.

With each of these clocks being locked to the same stable frequency standard, the number of interfering signals generated by a given degree of cross talk is substantially reduced. Hence the task of their removal in subsequent signal processing is made more straightforward.

A further critical issue in telemetry systems, especially for use in collecting seismic data, is the wide dynamic range of signals returned from the geophones. In order to take full advantage of this dynamic range, it is necessary to use very high resolution converters and to minimize any circuit generated cross talk or interference. A dynamic range of 24 bits, giving a resolution of 144 dB may be used, although this could be expected to increase in the future. With this level of dynamic range, minimisation of interference becomes extremely difficult and any mechanism which is able to maintain this dynamic range without adding significant, size or weight has a distinct practical advantage.

By use of the aforementioned oscillator locking, the clocks of the remote units within the telemetry system, and all of the data sample clocks remain in tight synchronisation, thereby reducing the significance of inaccuracies caused by timing, causing the ultimate limit of resolution to be the quantisation limit of the analogue to digital converters. This, in combination with the fact that internally generated noise is significantly reduced by driving the various clocks from a common source, significantly enhances system performance.

In testing, it has been possible to achieve remote unit frequency stability of 0.025 ppm over the whole working temperature range relative to the base station oscillator. This compares favourably with the uncorrected intrinsic stability of the remote unit voltage control oscillator, which typically exhibits a frequency error of up to ±10 ppm relative to the base station oscillator. This additional stability is very significant, especially given the wide temperature variation that may occur across the telemetry system.

What is claimed is:

1. A data communication system comprising a master unit containing a master clock and at least one remote unit, the or each remote unit having a local oscillator, in which the master unit transmits a signal containing at least first and second pilot signals at predetermined frequencies, and in which the or each remote unit is arranged to receive the pilot signals, to compare the frequencies of the received pilot signals with a local record of their frequencies, and to adjust the frequency of the local oscillator to reduce the difference between the received and expected pilot signal frequencies to below a threshold, wherein the received pilot signals comprise a pilot tone recovered from both the upper and lower sidebands of a carrier signal comprising the received signals.

2. A data communication system comprising:
a master unit having a master clock and a transmitter;
a remote unit having a local oscillator; in which the master unit transmits a carrier signal with upper and lower sidebands;
the sidebands have at least first and second pilot signals of predetermined frequencies;
the remote unit receives the transmitted signal;
the remote unit compares the frequencies of the received pilot signals with a local record of pilot signal frequencies;
the remote unit adjusts the frequency of the local oscillator to reduce the difference between the received pilot signal frequencies and the local record of pilot signal frequencies below a threshold;
the received pilot signals comprise two pilot tones recovered from both the upper and lower sidebands of a carrier signal; and
the received pilot signal comparison comprises locating the received pilot signals by looking for two tones in the received signal that are separated by the frequency difference between the pilot tones.

3. A data communication system comprising:
a master unit having a master clock and a transmitter;
a remote unit having a local oscillator; in which
the master unit transmits a carrier signal with upper and lower sidebands;
the sidebands have at least first and second pilot signals of predetermined frequencies;
the remote unit receives the pilot signals;
the remote unit compares the frequencies of the received pilot signals with a local record of pilot signal frequencies;
the remote unit adjusts the frequency of the local oscillator to reduce the difference between the received pilot signal frequencies and the local record of pilot signal frequencies below a threshold; and
the received pilot signal comparison comprises using a frequency shifted copy of the received pilot signals to locate the received pilot signals.

4. The data communication system of claim 3 in which:
the received pilot signals comprise two pilot tones; and
the frequency shifted copy of the received pilot signals is displaced from the received pilot signals by a frequency shift substantially equal to the separation of the two pilot tones.

5. The data communication system of claim 4 in which:
the pilot tones are inserted into a baseband signal transmitted by the master unit; and the transmitted signal is modulated to include information.

6. The data communication system of claim 5 in which the remote unit further comprises:
a local transmitter and a local receiver in which the power of the received pilot signals is used to estimate the transmission loss between the master unit and the remote unit; and
that estimate is used to control the transmission power of the local transmitter.

7. The data communication system of claim 6 in which:
the remote unit demodulates the received signal to recover the baseband signal and pilot tones.

8. The data communication system of claim 7 in which:
the remote unit modifies the received signal by mixing it with the signal of the local oscillator; and
the local receiver has a phase detector such that both the in-phase and out-of-phase components of the received signal are output from the detector.

9. The data communication system of claim 8 in which:
the remote unit has a signal processor to locate the pilot tones within the demodulated signal; and
the pilot tones are used to adjust the frequency of the local oscillator.

10. The data communication system of claim 9 in which:
the signal processor locates the pilot signals by looking for a known frequency difference between the pilot tones.

11. The data communication system of claim 10 in which:
the pilot tones are cross-correlated to improve identification of the pilot tones.

12. The data communication system of claim 11 in which:
the signal processor copies the demodulated signal; and frequency shifts the copy by a frequency nominally equal to the frequency difference between the pilot tones.

13. The data communication system of claim 12 in which:

the pilot tones are identified by performing a frequency domain analysis on the received and processed signals.

14. The data communication system of claim 13 in which:

the results of the frequency domain analysis on the received and processed signals are properly combined to enhance the pilot tones.

15. The data communication system of claim 14 in which:

a spread of frequencies is correlated to look for Doppler-shifted versions of the pilot signals.

16. The data communication system of claim 15 in which:

the signal processor searches to find the largest peak of the correlated signals; and the signal processor estimates a measure of confidence that the pilot tones are correctly identified by measuring the amount by which the largest correlation peak exceeds the remaining signals.

17. The data communication system of claim 16 in which:

the signal processor further compares the magnitude of the largest correlation peak with the magnitude of the second largest correlation peak to derive a ratio to indicate the degree of confidence that the pilot tones are correctly identified.

18. The data communication system of claim 17 in which:

once the signal processor has found the pilot tones with sufficient confidence, a new control voltage for the oscillator is calculated and generated based upon the error between the expected pilot tone frequencies and the received pilot tone frequencies.

19. A method of synchronizing a local oscillator with a master oscillator comprising:

providing a local receiver unit with a local record of expected pilot tone frequencies stored thereon;

transmitting first and second pilot tones in a modulated signal from a master unit;

receiving the modulated signal with said local receiver unit;

demodulating the received signal;

analyzing the demodulated signal to identify the first and second pilot tones by searching for at least one of the frequencies of the pilot tones or the frequency difference between the pilot tones;

comparing the frequencies of the demodulated pilot tones with the expected frequencies of the pilot tones stored in the local record to measure the frequency error; and modifying the frequency of the local oscillator to reduce the frequency error.

20. A method of synchronizing a local oscillator with a master oscillator comprising:

providing a master unit having a master clock and a transmitter;

providing a remote unit having a local oscillator;

transmitting a carrier signal with upper and lower sidebands from said master unit, wherein the sidebands have at least first and second pilot signals of predetermined frequencies;

receiving the transmitted signal at the remote unit;

recovering two pilot tones from both the upper and lower sidebands of the carrier signal;

comparing the frequencies of the received pilot signals with a remote unit local record of pilot signal frequencies; and adjusting the frequency of the local oscillator to reduce the difference between the received pilot signal frequencies and the local record of pilot signal frequencies below a threshold, wherein the step of comparing comprises locating the received pilot signals by looking for two tones in the received signal that are separated by the frequency difference between the pilot tones.

* * * * *